United States Patent [19]
Yee et al.

[11] Patent Number: 5,227,680
[45] Date of Patent: Jul. 13, 1993

[54] ECL/TTL TRANSLATOR CIRCUIT

[75] Inventors: Loren Yee, Milpitas; Nguyen X. Sinh, San Jose, both of Calif.

[73] Assignee: National Semiconductor Corporation, Santa Clara, Calif.

[21] Appl. No.: 790,606

[22] Filed: Nov. 8, 1991

Related U.S. Application Data

[63] Continuation of Ser. No. 437,473, Nov. 15, 1989, abandoned.

[51] Int. Cl.$^5$ .................... H03B 1/04; H03K 19/0175
[52] U.S. Cl. ........................................ 307/475; 307/455; 307/456; 307/542; 307/546; 307/354
[58] Field of Search .................... 307/443, 455–456, 307/475, 542, 546, 354

[56] References Cited

U.S. PATENT DOCUMENTS

| | | | |
|---|---|---|---|
| 4,782,248 | 11/1988 | Overs | 307/455 |
| 4,874,970 | 10/1989 | Coy et al. | 307/475 |
| 4,996,452 | 2/1991 | Yee et al. | 307/475 |
| 5,045,729 | 9/1991 | Yee et al. | 307/475 |

Primary Examiner—William L. Sikes
Assistant Examiner—Margaret R. Wambach
Attorney, Agent, or Firm—Townsend and Townsend Khourie and Crew

[57] ABSTRACT

An ECL/TTL translation circuit for translating ECL level input signals, which have a high voltage state and a low voltage state, to TTL level output signal, which have a high voltage state and a low voltage state. The translation circuit includes an ECL input circuit, a level shifter, and a TTL output circuit. The ECL input circuit receives the ECL level input signals and generates an intermediate voltage signal corresponding to the ECL level input signal. The level shifter is coupled to the ECL input circuit and maintains the intermediate voltage signal in a desired range of voltages. The TTL output circuit receives the intermediate voltage signal and generates a TTL output signal that corresponds to the intermediate voltage signal and, therefore, corresponds to the ECL input signal.

5 Claims, 3 Drawing Sheets

ECL/TTL TRANSLATOR CIRCUIT

This is a continuation of application Ser. No. 07/437,473, filed Nov. 15, 1989, now abandoned.

CROSS REFERENCE TO RELATED APPLICATIONS

Related co-pending applications include "ECL/TTL TRISTATE BUFFER" filed Nov. 15, 1989, Ser. No. 07/436,846, now U.S. Pat. No. 4,996,452, and "TTL/ECL TRANSLATOR CIRCUIT", filed Nov. 15, 1989, Ser. No. 07/436,842, now U.S. Pat. No. 5,045,729.

BACKGROUND OF THE INVENTION

The present invention relates generally to translator circuits, and more specifically, to emitter coupled logic (ECL) to transistor-transistor logic (TTL) translator circuits for receiving ECL voltage level input signals and generating TTL voltage level output signals.

TTL circuitry and ECL circuitry are two well known types of digital circuitry for use in computers and other logic devices. In TTL circuitry a binary "1" is represented by high voltage level between 2.5 and 5 volts, and a binary "0" is represented by a low voltage level between 0 and 0.8 volts. TTL circuitry is generally known for operating at high speed and having low power requirements.

ECL circuitry generally operates at negative voltage with the high and low level voltage signal established on either side of a desired negative reference voltage. For example, if a reference voltage is −1.16 volts, a binary "1" may be represented by a voltage level of −0.8 volts and a binary "0" may be represented by voltage level of −1.5 volts. ECL circuitry is generally known for higher speed switches.

To obtain the advantages of employing both ECL and TTL circuitry on a single integrated circuit or in a system using many circuits, translators are required for translating the binary data from the ECL voltage level to the TTL voltage level.

One such ECL to TTL translator is illustrated in FIG. 1 as disclosed in U.S. Pat. No. 4,677,320. An ECL input signal is received at input node ECL Vin, and a corresponding TTL output signal is generated at output node TTL Vout. Although the translator circuit has few devices, it will be slow if resistors RL1 and RL2 are large or it will lack the ability to drive a high capacitance load if resistors RL1 and RL2 are small.

SUMMARY OF THE INVENTION

The present invention provides an ECL/TTL translation circuit for translating ECL level input signals, which have a high voltage state and a low voltage state, to TTL level output signals, which have a high voltage state and a low voltage state.

The translation circuit includes an ECL input circuit, a level shifter, and a TTL output circuit. The ECL input circuit receives the ECL level input signals and generates an intermediate voltage signal corresponding to the ECL level input signal. The level shifter is coupled to the ECL input circuit and maintains the intermediate voltage signal in a desired range of voltages. The TTL output circuit receives the intermediate voltage signal and generates a TTL output signal that corresponds to the intermediate voltage signal and, therefore, corresponds to the ECL input signal.

The ECL input circuit includes an ECL cascode stage for comparing the ECL input signal with a reference signal. The ECL input circuit also includes current source circuit for providing switching current to the ECL cascode.

The level shifter includes a voltage clamp for preventing the intermediate voltage signal from entering a constant high state. The level shifter also includes a pull-up circuit for preventing the intermediate voltage signal from entering a constant low state.

In a preferred embodiment, the circuit of the present invention contains few active devices, resulting in the translation circuit being more reliable and faster. In addition, because the level shifter is primarily composed of resistors and diodes coupled in series, the problems of voltage breakdown are minimized, while the speed of the translation circuit is increased. Furthermore, the TTL output circuit is able to drive high capacitance loads.

A further understanding of the nature and advantages of the invention may be realized by reference to the remaining portions of the specification and the attached drawings.

A BRIEF DESCRIPTION OF THE DRAWINGS

FIG. 1 is a schematic diagram of an ECL to TTL translator as disclosed in U.S. Pat. No. 4,677,320;

DETAILED DESCRIPTION OF THE PREFERRED EMBODIMENTS

Figure 1:
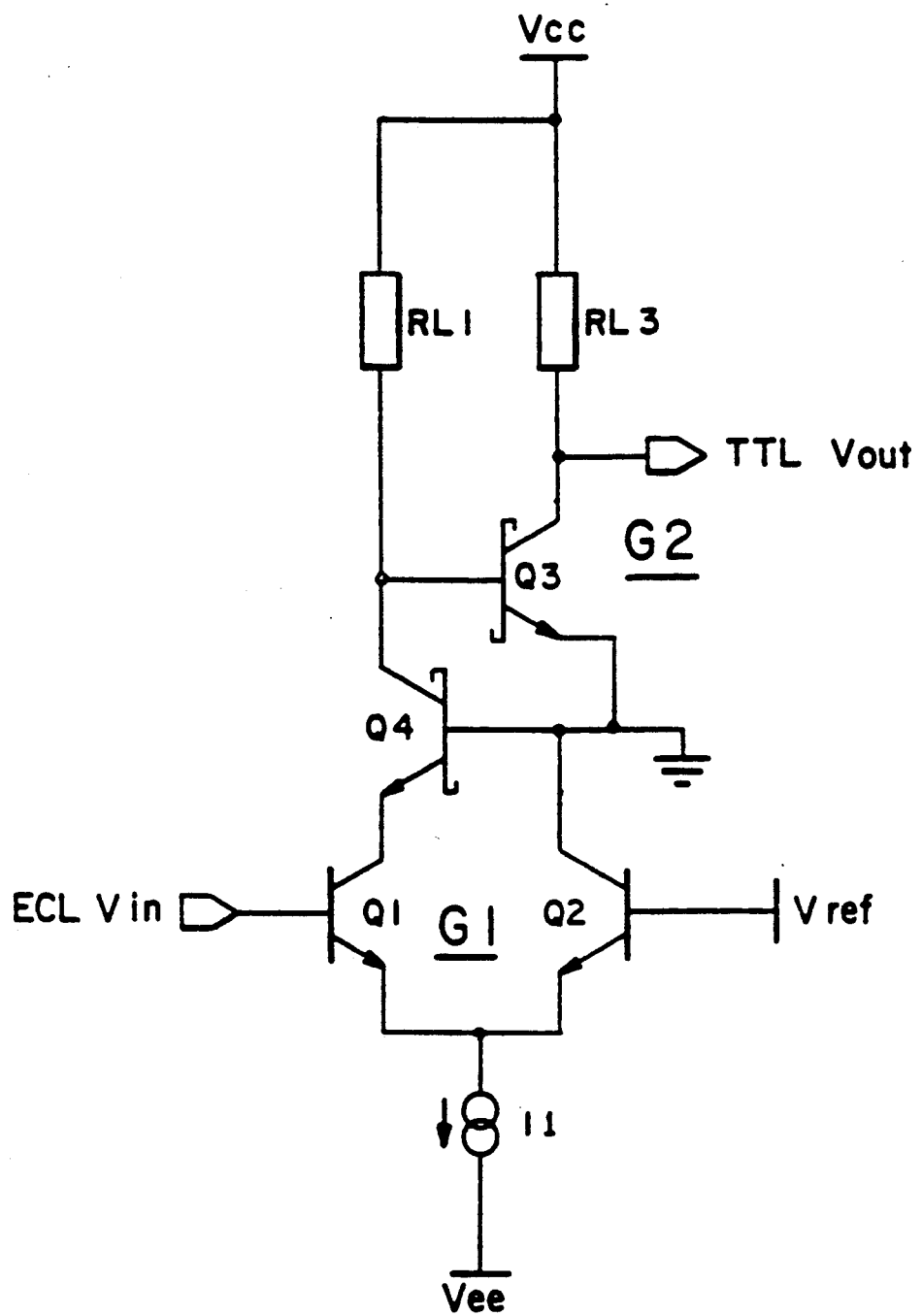
Figure 2:
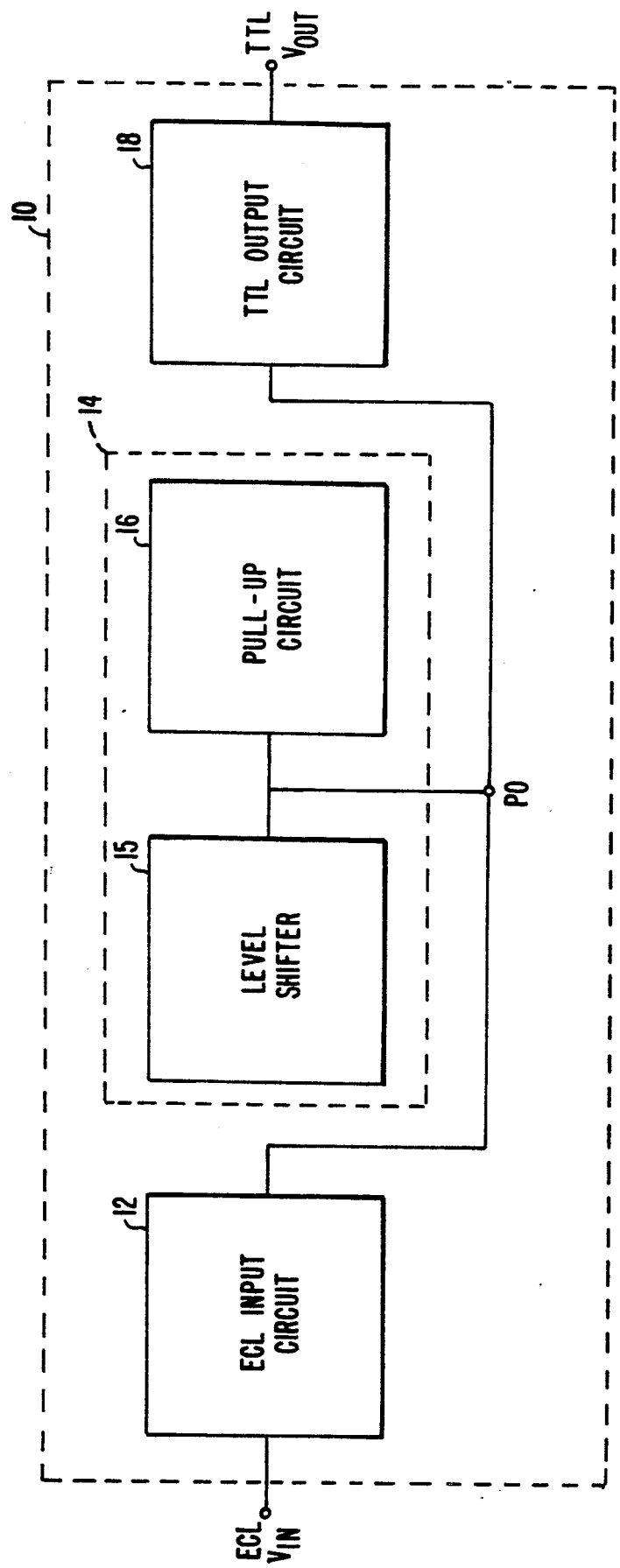
FIG. 2 is a block diagram of a preferred embodiment of the invention.

FIG. 2 is a block diagram of a preferred ECL/TTL translator circuit 10 that receives an ECL input signal and generates a corresponding TTL output signal. The ECL/TTL translator circuit includes an ECL input circuit 12, a level shifter 14 including a voltage clamp 15 and a pull-up circuit 16, and a TTL output circuit 18.

ECL input circuit 12 receives and buffers the ECL input signal at node ECL Vin. The ECL input circuit then generates and transmits an intermediate signal at node PO corresponding to the ECL input signal. Level shifter 14 includes voltage clamp 15 for preventing the intermediate voltage signal from entering a constant low state, and also includes pull-up circuit 16 for preventing the intermediate voltage signal from entering a constant high state. TTL output circuit 18 generates and transmits a TTL output signal that corresponds to the intermediate voltage signal and, therefore, corresponds to the ECL input signal.

Figure 3:
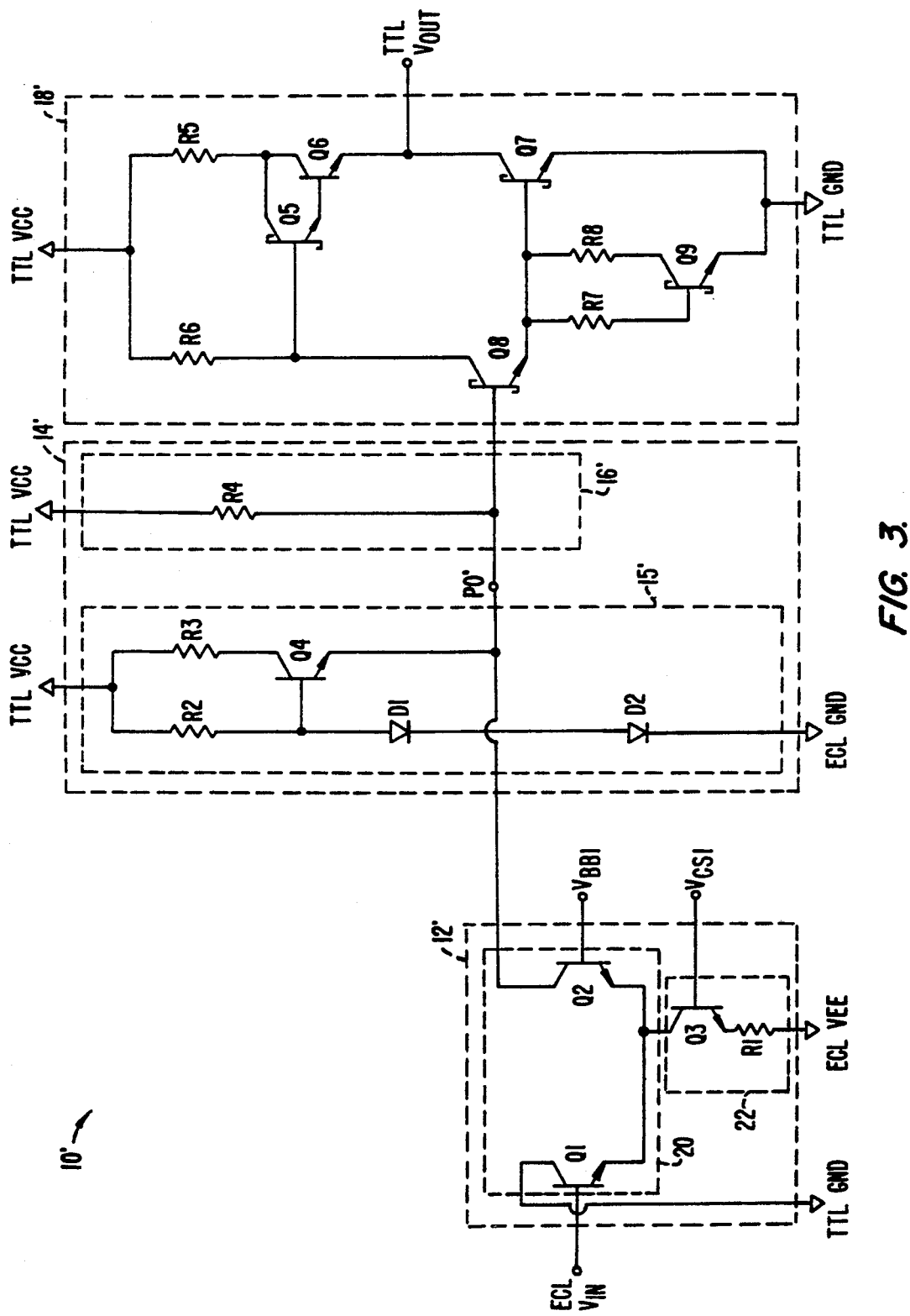
FIG. 3 is a schematic diagram of a preferred embodiment of the invention.

FIG. 3 is a schematic diagram of a preferred ECL/TTL translator circuit 10' that includes an ECL input circuit 12', an intermediate voltage node PO', a level shifter 14' including a voltage clamp 15' and a pull-up circuit 16', and a TTL output circuit 18' corresponding to the elements of the block diagram shown in FIG. 2.

ECL input circuit 12' includes an ECL cascode stage 20 and a current source circuit 22. ECL cascode stage 20 compares ECL input signal ECL Vin with a reference voltage $V_{BB1}$ which is preferably set to approximately −1.16 volts. Current source circuit 22 also utilizes a reference voltage $V_{CS1}$ to provide a switching current to the ECL cascode. Reference voltage $V_{CS1}$ is normally set to approximately 1.32 above VEE or approximately −3.68 volts.

In the preferred embodiment, the ECL cascode includes transistors Q1 and Q2 with Q1 receiving the ECL Vin signal and Q2 receiving the reference voltage $V_{BB1}$. In addition, the current source circuit includes transistor Q3 and resistor R1 connected in series between the emitters of transistors Q1 and Q2 and ECL VEE. The base of Q3 is connected to reference voltage $V_{CSI}$.

Upon receiving an ECL input signal in a low state (voltage less than $V_{BB1}$), transistor Q1 is turned on and current is pulled through transistor Q1 by current source circuit 22. Due to this current flow, transistor Q2 is turned off, causing the voltage at node PO' to drop to one diode drop (1 Vbe or approximately 0.8 volts) above ECL GND. Upon receiving an ECL input signal in a high state (voltage greater than −0.8 volts), transistor Q1 turns off, and current is pulled through transistor Q2 by current source circuit 22. Due to this current flow, transistor Q2 is turned on, thereby pulling the voltage at node PO' up to two diode drops (2 Vbe or approximately 1.6 volts) above ECL GND.

Level shifter 14' includes a voltage clamp 15' and pull-up circuit 16' coupled to node PO'. Voltage clamp 15' prevents the intermediate voltage signal on node PO' from entering a constant high state. Pull-up circuit 16' prevents intermediate voltage on node PO' for entering a constant low state.

In the preferred embodiment, voltage clamp 15' includes resistors R2 and R3 in parallel with resistor R2 being in series with diode D1 and D2 between TTL VCC and ECL GND. In addition, transistor Q4 is located in series with resistor R3 between TTL VCC and node PO'. When an intermediate low voltage signal is generated by the ECL input circuit, voltage clamp 15' clamps node PO' at approximately 0.8 volts or 1 Vbe above ECL GND (diode D1 +diode D2−transistor Q4). In addition, pull-up circuit 16' includes a resistor R4 located between TTL VCC and node PO' to enhance rise time at node PO'. Furthermore, the low voltage swing at node PO' permits faster operation of the translation circuit.

TTL output circuit 18' includes several resistors and transistors for generating and driving a TTL output signal at node TTL Vout corresponding to the intermediate voltage signal at node PO'. Resistor R5, darlington configured transistor pair Q5 and Q6, and Schottky transistor Q7 are connected in series between TTL VCC and TTL GND. In addition, resistor R6, Schottky transistor Q8, resistors R7 and R8, and Schottky transistor Q9 are also connected in series between TTL VCC and TTL GND.

Upon receiving an intermediate low voltage signal at approximately 0.8 volts or 1 Vbe above ECL GND at node PO', transistor Q8 turns off, causing transistor Q7 to turn off. Although darlington configured transistor pair Q5 and Q6 remain on, Schottky transistor Q7 pulls TTL Vout down to 1 Vbe (approximately 0.8 volts) above TTL GND. Upon receiving an intermediate high voltage signal of approximately 1.6 volts or 2 Vbe above ECL GND at node PO', transistor Q8 turns on, causing transistor Q7 to turn on. As a result, TTL Vout is pulled upward to approximately 2.7 to 3.5 volts depending on the output capacitance load.

As is well understood by those familiar with the art, the present invention may be embodied in other specific forms without departing from the spirit or essential characteristics thereof. For example, the diodes may be replaced with diode configured transistors. For another example, ECL GND and TTL GND may be shorted together to reduce noise. Accordingly, the disclosure of the preferred embodiment of the invention is intended to be illustrative, but not limiting, of the scope of the invention which is set forth in the following claims.

What is claimed is:

1. A circuit for translating ECL input signals to TTL output signals comprising:
    input circuit means for receiving said ECL input signals and generating corresponding responses to said ECL input signals;
    output circuit means for generating TTL level signals responsive to the corresponding responses generated by said input circuit means;
    said output circuit means coupled to said input circuit means at a common node;
    level shifting circuit means, coupled to said common node, for limiting a voltage swing at said common node and for increasing a transition from a first voltage state at said common node to a second voltage state;
    wherein said output circuit means comprises a resistor, a Darlington transistor pair and a Schottky transistor connected in series between a TTL VCC reference voltage and a ground voltage;
    a base of said Darlington transistor pair resistively coupled to TTL VCC reference voltage and coupled to a first terminal of a second Schottky transistor;
    a base of said first Schottky transistor connected to a second terminal of said second Schottky transistor and coupled to ground voltage by a Schottky transistor clamp circuit means;
    wherein said common node has a maximum voltage two diode drops above said ground voltage.

2. The circuit of claim 1 wherein said level shifting means comprise a voltage clamp and a pull up means.

3. The circuit of claim 2 wherein said voltage clamp comprises two diodes coupled between said TTL VCC reference voltage and ground voltage, and a clamp transistor having a base coupled through said diodes to ground voltage, a collector resistively coupled to TTL VCC reference voltage, and an emitter connected to said common node whereby said common node is clamped to substantially one diode drop above ground voltage when said clamp transistor is conducting.

4. A circuit for translating ECL input signals to TTL output signals comprising:
    input circuit means for receiving said ECL input signals and generating corresponding responses to said ECL input signals;
    output circuit means for generating TTL level signals responsive to the corresponding responses generated by said input circuit means;
    said output circuit means coupled to said input circuit means at a single common node;
    level shifting circuit means, coupled to said common node, for limiting a voltage swing at said common node and for increasing a transition from a first voltage state at said common node to a second voltage state;
    wherein said input circuit means comprises an ECL comparator having a first transistor emitter-coupled to a second transistor;
    said emitter-coupled transistors further coupled to ECL VEE by a current source;

said first transistor having a collector coupled to a reference voltage and a base adapted to receive said ECL input signals;

said second transistor having a collector coupled to said common node and a base coupled to a reference signal whereby said first transistor conducts current from the reference voltage through said current source to the exclusion of said second transistor when said ECL input signal is greater than said reference signal, and said second transistor conducts current through said current source to the exclusion of said first transistor when said ECL signal is less than said reference signal.

5. A circuit for translating ECL level input signals to TTL level output signals, the circuit comprising:
   a) an intermediate voltage node capable of switching between a high voltage state and a low voltage state;
   b) an ECL comparator, coupled to the intermediate voltage node, for receiving the ECL level input signals, for comparing the ECL input signals with a reference signal, and for generating an intermediate voltage signal on the intermediate voltage node corresponding to the ECL level signals;
   c) a current source, coupled to the ECL comparator, for providing a switching current to the ECL comparator;
   d) a voltage clamp, coupled to the intermediate voltage node, for preventing the intermediate voltage signal from entering a constant high state;
   e) a pull up means, coupled to the intermediate voltage node, for preventing the intermediate voltage signal from entering a constant low state; and
   f) TTL output means, coupled to the intermediate voltage node, responsive to the intermediate voltage signal, for generating TTL level output signals corresponding to the intermediate voltage signal, thereby providing TTL level output signals corresponding to the ECL level input signals.

* * * * *